US012726200B2

(12) United States Patent
Wang et al.

(10) Patent No.: US 12,726,200 B2
(45) Date of Patent: Sep. 1, 2026

(54) DRIVER AND TRANSMITTER

(71) Applicant: Beijing T-Head Information Technology Co., Ltd., Beijing (CN)

(72) Inventors: Lei Wang, Shanghai (CN); Haidong Yang, ShenZhen City (CN); Yang Xiao, Shanghai (CN); Min Li, Shanghai (CN); Shengjang Lin, ShenZhen City (CN)

(73) Assignee: BEIJING T-HEAD INFORMATION TECHNOLOGY CO., LTD., Beijing (CN)

( * ) Notice: Subject to any disclaimer, the term of this patent is extended or adjusted under 35 U.S.C. 154(b) by 17 days.

(21) Appl. No.: 19/003,470

(22) Filed: Dec. 27, 2024

(65) Prior Publication Data

US 2026/0121643 A1 Apr. 30, 2026

(30) Foreign Application Priority Data

Jan. 15, 2024 (CN) ........................ 202410058161.X

(51) Int. Cl.
*H03K 19/0185* (2006.01)
*H03K 17/06* (2006.01)
*H03K 19/003* (2006.01)

(52) U.S. Cl.
CPC ... *H03K 19/018528* (2013.01); *H03K 17/063* (2013.01); *H03K 19/00361* (2013.01); *H03K 2217/0081* (2013.01)

(58) Field of Classification Search
CPC ..... H03K 19/018528; H03K 19/00361; H03K 17/063; H03K 2217/0081
See application file for complete search history.

(56) References Cited

U.S. PATENT DOCUMENTS

| | | | | |
|---|---|---|---|---|
| 7,598,779 | B1 * | 10/2009 | Wang | H04L 25/0272 327/108 |
| 9,722,819 | B2 * | 8/2017 | Akita | H04L 25/03 |
| 10,790,636 | B1 * | 9/2020 | Abdelhalim | H01S 5/0427 |
| 2015/0214977 | A1 | 7/2015 | De Marco et al. | |
| 2016/0352315 | A1 * | 12/2016 | Blecher | H03K 17/60 |

(Continued)

FOREIGN PATENT DOCUMENTS

| | | | |
|---|---|---|---|
| CN | 1458744 | A | 11/2003 |
| CN | 102916704 | A | 2/2013 |

(Continued)

*Primary Examiner* — Seokjin Kim
(74) *Attorney, Agent, or Firm* — Birch, Stewart, Kolasch & Birch, LLP

(57) ABSTRACT

Provided are a driver and a transmitter. The driver includes: an n-type metal-oxide-semiconductor field-effect transistor differential circuit, a p-type metal-oxide-semiconductor field-effect transistor differential circuit and a power supply. Gate electrodes of the p-type metal-oxide-semiconductor field-effect transistor differential circuit and the n-type metal-oxide-semiconductor field-effect transistor differential circuit receive a first level signal. The p-type and n-type metal-oxide-semiconductor field-effect transistor differential circuits convert the first level signal into a second level signal used by an actuator. Drain electrodes of the p-type and n-type metal-oxide-semiconductor field-effect transistor differential circuits output the second level signal.

15 Claims, 5 Drawing Sheets

(56) References Cited

U.S. PATENT DOCUMENTS

| | | | | |
|---|---|---|---|---|
| 2019/0044768 | A1* | 2/2019 | Kim | H04L 27/04 |
| 2021/0367710 | A1* | 11/2021 | Mouchel La Foss | H04L 69/324 |
| 2023/0208677 | A1* | 6/2023 | Kaulmann | H04L 12/407 |
| 2026/0089037 | A1* | 3/2026 | Tamura | H04L 25/0278 |

FOREIGN PATENT DOCUMENTS

| | | | | |
|---|---|---|---|---|
| CN | 111431618 A | | 7/2020 | |
| CN | 112994798 A | | 6/2021 | |
| CN | 115412092 A | | 11/2022 | |
| CN | 116915224 A | | 10/2023 | |
| CN | 116938222 A | | 10/2023 | |
| WO | WO-2004023749 A1 | * | 3/2004 | H04L 25/028 |

* cited by examiner

DRIVER AND TRANSMITTER

CROSS-REFERENCE TO RELATED APPLICATIONS

The present application claims the priority of Chinese Patent Application No. 202410058161.X, entitled "Driver and Transmitter", and filed with the China National Intellectual Property Administration on Jan. 15, 2024, which is incorporated in the present disclosure by reference in its entirety.

TECHNICAL FIELD

The present application relates to the technical field of semiconductors, and in particular to a driver and a transmitter.

BACKGROUND

A driver is an important part of a wired transmitter. With the exponential growth of data throughput, in addition to a traditional non return to zero (NRZ) data modulation mode, a high-speed wired transmitter often adopts a higher-order amplitude modulation mode: a 4-level pulse amplitude modulation (PAM-4) signal, so the driver is also required to meet dual-mode transmission of two modes NRZ and PAM-4. As a module with the highest working speed and the highest output swing in the transmitter, the driver is developing towards broadband, low power consumption and high linearity.

At present, the driver using a source series terminated (SST) structure implements the transmission of the PAM-4 signal by adjusting a series resistance ratio of least significant bit (LSB) and most significant bit (MSB) paths.

However, since the matching impedance is a series resistance, the impedance seen from an active output node is larger. For the same output swing, the driver using the SST structure has low power consumption, but the output bandwidth will be lower.

SUMMARY

The present disclosure provides a driver and a transmitter.

According to one aspect, embodiments of the present application provide a driver. The driver includes: an n-type metal-oxide-semiconductor field-effect transistor differential circuit, a p-type metal-oxide-semiconductor field-effect transistor differential circuit and a power supply.

The power supply is connected to a source electrode of the p-type metal-oxide-semiconductor field-effect transistor differential circuit, a drain electrode of the p-type metal-oxide-semiconductor field-effect transistor differential circuit is connected to a drain electrode of the n-type metal-oxide-semiconductor field-effect transistor differential circuit, and a source electrode of the n-type metal-oxide-semiconductor field-effect transistor differential circuit is grounded.

A gate electrode of the p-type metal-oxide-semiconductor field-effect transistor differential circuit and a gate electrode of the n-type metal-oxide-semiconductor field-effect transistor differential circuit are configured to receive a first level signal. The p-type metal-oxide-semiconductor field-effect transistor differential circuit and the n-type metal-oxide-semiconductor field-effect transistor differential circuit are configured to convert the first level signal into a second level signal used by an actuator.

The drain electrode of the p-type metal-oxide-semiconductor field-effect transistor differential circuit and the drain electrode of the n-type metal-oxide-semiconductor field-effect transistor differential circuit are configured to output the second level signal.

In some embodiments, the driver further includes: an auxiliary voltage adjusting circuit.

The auxiliary voltage adjusting circuit is connected to the drain electrode of the p-type metal-oxide-semiconductor field-effect transistor differential circuit and the drain electrode of the n-type metal-oxide-semiconductor field-effect transistor differential circuit.

When detecting that the drain electrode of the p-type metal-oxide-semiconductor field-effect transistor differential circuit and a field-effect transistor in the n-type metal-oxide-semiconductor field-effect transistor differential circuit are in an off state, the auxiliary voltage adjusting circuit is configured to provide a common mode voltage and output a signal, the signal is obtained by superimposing the second level signal on the common mode voltage.

In some embodiments, the n-type metal-oxide-semiconductor field-effect transistor differential circuit includes: a first n-type metal-oxide-semiconductor field-effect transistor and a second n-type metal-oxide-semiconductor field-effect transistor.

A gate electrode of the first n-type metal-oxide-semiconductor field-effect transistor is configured to receive a binary least significant bit positive signal in the first level signal, and a gate electrode of the second n-type metal-oxide-semiconductor field-effect transistor is configured to receive a binary least significant bit negative signal in the first level signal.

In some embodiments, the p-type metal-oxide-semiconductor field-effect transistor differential circuit includes: a first p-type metal-oxide-semiconductor field effect transistor and a second p-type metal-oxide-semiconductor field effect transistor.

A gate electrode of the first p-type metal-oxide-semiconductor field-effect transistor is configured to receive a binary most significant bit positive signal in the first level signal, and a gate electrode of the second p-type metal-oxide-semiconductor field-effect transistor is configured to receive a binary most significant bit negative signal in the first level signal.

In some embodiments, a drain electrode of the first n-type metal-oxide-semiconductor field-effect transistor is connected to a drain electrode of the first p-type metal-oxide-semiconductor field-effect transistor, and a drain electrode of the second n-type metal-oxide-semiconductor field-effect transistor is connected to a drain electrode of the second p-type metal-oxide-semiconductor field-effect transistor.

The drain electrode of the first n-type metal-oxide-semiconductor field-effect transistor and the drain electrode of the first p-type metal-oxide-semiconductor field-effect transistor are jointly configured to output a negative signal of the second level signal.

The drain electrode of the second n-type metal-oxide-semiconductor field-effect transistor and the drain electrode of the second p-type metal-oxide-semiconductor field-effect transistor are jointly configured to output a positive signal of the second level signal.

In some embodiments, the auxiliary voltage adjusting circuit includes: a third p-type metal-oxide-semiconductor field-effect transistor and an integrated digital-to-analog converter. A source electrode of the third p-type metal-oxide-semiconductor field-effect transistor is connected to the power supply. A gate electrode of the third p-type metal-oxide-semiconductor field-effect transistor is connected to the integrated digital-to-analog converter and configured to receive an adjusting signal input by the integrated digital-to-analog converter. The third p-type metal-oxide-semiconductor field-effect transistor is configured to generate the common mode voltage based on the adjusting signal.

In some embodiments, the auxiliary voltage adjusting circuit further includes: a first impedance matching resistor and a second impedance matching resistor.

A first end of the first impedance matching resistor and a first end of the second impedance matching resistor are respectively connected to a drain electrode of the third p-type metal-oxide-semiconductor field-effect transistor. A second end of the first impedance matching resistor is connected to a drain electrode of the first n-type metal-oxide-semiconductor field-effect transistor, and the first impedance matching resistor performs impedance matching processing on a signal at the drain electrode of the first n-type metal-oxide-semiconductor field-effect transistor. A second end of the second impedance matching resistor is connected to a drain electrode of the second n-type metal-oxide-semiconductor field-effect transistor, and the second impedance matching resistor performs impedance matching processing on a signal at the drain electrode of the second n-type metal-oxide-semiconductor field-effect transistor.

In some embodiments, the number of the first impedance matching resistor and the number of the second impedance matching resistor are at least one, respectively.

In some embodiments, the integrated digital-to-analog converter is an integrated digital-to-analog converter with 5-bit resolution.

According to another aspect, the embodiments of the present application provide a transmitter, including: a driver, an encoder, an actuator and a control circuit.

The control circuit is respectively connected to the driver, the encoder and the actuator and configured to monitor and adjust the operation states of the driver, the encoder and the actuator. The encoder is connected to the driver and configured to input a first level signal to the driver. The driver is configured to convert the first level signal into a second level signal. The actuator is connected to the driver and configured to receive the second level signal and execute an action corresponding to the second level signal.

The driver includes: an n-type metal-oxide-semiconductor field-effect transistor differential circuit, a p-type metal-oxide-semiconductor field-effect transistor differential circuit and a power supply. The power supply is connected to a source electrode of the p-type metal-oxide-semiconductor field-effect transistor differential circuit, a drain electrode of the p-type metal-oxide-semiconductor field-effect transistor differential circuit is connected to a drain electrode of the n-type metal-oxide-semiconductor field-effect transistor differential circuit, and a source electrode of the n-type metal-oxide-semiconductor field-effect transistor differential circuit is grounded. The gate electrode of the p-type metal-oxide-semiconductor field-effect transistor differential circuit and a gate electrode of the n-type metal-oxide-semiconductor field-effect transistor differential circuit are configured to receive the first level signal, the p-type metal-oxide-semiconductor field-effect transistor differential circuit and the n-type metal-oxide-semiconductor field-effect transistor differential circuit are configured to convert the first level signal into the second level signal. The drain electrode of the p-type metal-oxide-semiconductor field-effect transistor differential circuit and the drain electrode of the n-type metal-oxide-semiconductor field-effect transistor differential circuit are configured to output the second level signal.

In some embodiments, the driver further includes: an auxiliary voltage adjusting circuit. The auxiliary voltage adjusting circuit is connected to the drain electrode of the p-type metal-oxide-semiconductor field-effect transistor differential circuit and the drain electrode of the n-type metal-oxide-semiconductor field-effect transistor differential circuit. When detecting that the drain electrode of the p-type metal-oxide-semiconductor field-effect transistor differential circuit and a field-effect transistor in the n-type metal-oxide-semiconductor field-effect transistor differential circuit are in an off state, the auxiliary voltage adjusting circuit provides a common mode voltage and outputs a signal, the signal is obtained by superimposing the second level signal on the common mode voltage.

In some embodiments, the n-type metal-oxide-semiconductor field-effect transistor differential circuit includes: a first n-type metal-oxide-semiconductor field-effect transistor and a second n-type metal-oxide-semiconductor field-effect transistor. A gate electrode of the first n-type metal-oxide-semiconductor field-effect transistor is configured to receive a binary least significant bit positive signal in the first level signal, and a gate electrode of the second n-type metal-oxide-semiconductor field-effect transistor is configured to receive a binary least significant bit negative signal in the first level signal.

In some embodiments, the p-type metal-oxide-semiconductor field-effect transistor differential circuit includes: a first p-type metal-oxide-semiconductor field effect transistor and a second p-type metal-oxide-semiconductor field effect transistor. A gate electrode of the first p-type metal-oxide-semiconductor field-effect transistor is configured to receive a binary most significant bit positive signal in the first level signal, and a gate electrode of the second p-type metal-oxide-semiconductor field-effect transistor is configured to receive a binary most significant bit negative signal in the first level signal.

In some embodiments, a drain electrode of the first n-type metal-oxide-semiconductor field-effect transistor is connected to a drain electrode of the first p-type metal-oxide-semiconductor field-effect transistor, and a drain electrode of the second n-type metal-oxide-semiconductor field-effect transistor is connected to a drain electrode of the second p-type metal-oxide-semiconductor field-effect transistor. The drain electrode of the first n-type metal-oxide-semiconductor field-effect transistor and the drain electrode of the first p-type metal-oxide-semiconductor field-effect transistor are jointly configured to output a negative signal of the second level signal. The drain electrode of the second n-type metal-oxide-semiconductor field-effect transistor and the drain electrode of the second p-type metal-oxide-semiconductor field-effect transistor are jointly configured to output a positive signal of the second level signal.

In some embodiments, the auxiliary voltage adjusting circuit includes: a third p-type metal-oxide-semiconductor field-effect transistor and an integrated digital-to-analog converter; a source electrode of the third p-type metal-oxide-semiconductor field-effect transistor is connected to the power supply. A gate electrode of the third p-type metal-oxide-semiconductor field-effect transistor is connected to the integrated digital-to-analog converter and configured to receive an adjusting signal outputted by the integrated digital-to-analog converter. The third p-type metal-oxide-semiconductor field-effect transistor is configured to generate the common mode voltage based on the adjusting signal.

In some embodiments, the auxiliary voltage adjusting circuit further includes: a first impedance matching resistor and a second impedance matching resistor. A first end of the first impedance matching resistor and a first end of the second impedance matching resistor are both connected to a drain electrode of the third p-type metal-oxide-semiconductor field-effect transistor. A second end of the first impedance matching resistor is connected to a drain electrode of the first n-type metal-oxide-semiconductor field-effect transistor, and the first impedance matching resistor performs impedance matching processing on a signal at the drain electrode of the first n-type metal-oxide-semiconductor field-effect transistor. A second end of the second impedance matching resistor is connected to a drain electrode of the second n-type metal-oxide-semiconductor field-effect transistor, and the second impedance matching resistor performs impedance matching processing on a signal at the drain electrode of the second n-type metal-oxide-semiconductor field-effect transistor.

In some embodiments, a number of the first impedance matching resistor is at least one, and a number of the second impedance matching resistor is at least one.

In some embodiments, the integrated digital-to-analog converter is an integrated digital-to-analog converter with 5-bit resolution.

According to yet another aspect, the embodiments of the present application provide a data interface circuit, including a driver. The driver includes: an n-type metal-oxide-semiconductor field-effect transistor differential circuit, a p-type metal-oxide-semiconductor field-effect transistor differential circuit and a power supply. The power supply is connected to a source electrode of the p-type metal-oxide-semiconductor field-effect transistor differential circuit, a drain electrode of the p-type metal-oxide-semiconductor field-effect transistor differential circuit is connected to a drain electrode of the n-type metal-oxide-semiconductor field-effect transistor differential circuit, and a source electrode of the n-type metal-oxide-semiconductor field-effect transistor differential circuit is grounded. A gate electrode of the p-type metal-oxide-semiconductor field-effect transistor differential circuit and a gate electrode of the n-type metal-oxide-semiconductor field-effect transistor differential circuit are configured to receive the first level signal, the p-type metal-oxide-semiconductor field-effect transistor differential circuit and the n-type metal-oxide-semiconductor field-effect transistor differential circuit are configured to convert the first level signal into the second level signal. The drain electrode of the p-type metal-oxide-semiconductor field-effect transistor differential circuit and the drain electrode of the n-type metal-oxide-semiconductor field-effect transistor differential circuit are configured to output the second level signal.

According to the driver and the transmitter provided by the embodiments of the present disclosure, the driver includes: an n-type metal-oxide-semiconductor field-effect transistor differential circuit, a p-type metal-oxide-semiconductor field-effect transistor differential circuit and a power supply. The power supply is connected to a source electrode of the p-type metal-oxide-semiconductor field-effect transistor differential circuit, a drain electrode of the p-type metal-oxide-semiconductor field-effect transistor differential circuit is connected to a drain electrode of the n-type metal-oxide-semiconductor field-effect transistor differential circuit, and a source electrode of the n-type metal-oxide-semiconductor field-effect transistor differential circuit is grounded. A gate electrode of the p-type metal-oxide-semiconductor field-effect transistor differential circuit and a gate electrode of the n-type metal-oxide-semiconductor field-effect transistor differential circuit are configured to receive a first level signal. The p-type metal-oxide-semiconductor field-effect transistor differential circuit and the n-type metal-oxide-semiconductor field-effect transistor differential circuit are configured to convert the first level signal into a second level signal used by an actuator. The drain electrode of the p-type metal-oxide-semiconductor field-effect transistor differential circuit and a drain electrode of the n-type metal-oxide-semiconductor field-effect transistor differential circuit are configured to output a second level signal. The technical solution uses PMOS and NMOS transistors with low power to construct the driver so as to implement dual-mode transmission of PAM4/NRZ and endow a wider output bandwidth.

BRIEF DESCRIPTION OF DRAWINGS

The accompanying drawings illustrated herein are provided to further understand the present application and form a part of the present application. The exemplary embodiments of the present application and the descriptions thereof are used to explain the present application and do not constitute an improper limitation on the present application. In the drawings.

DETAILED DESCRIPTION

Figure 1:
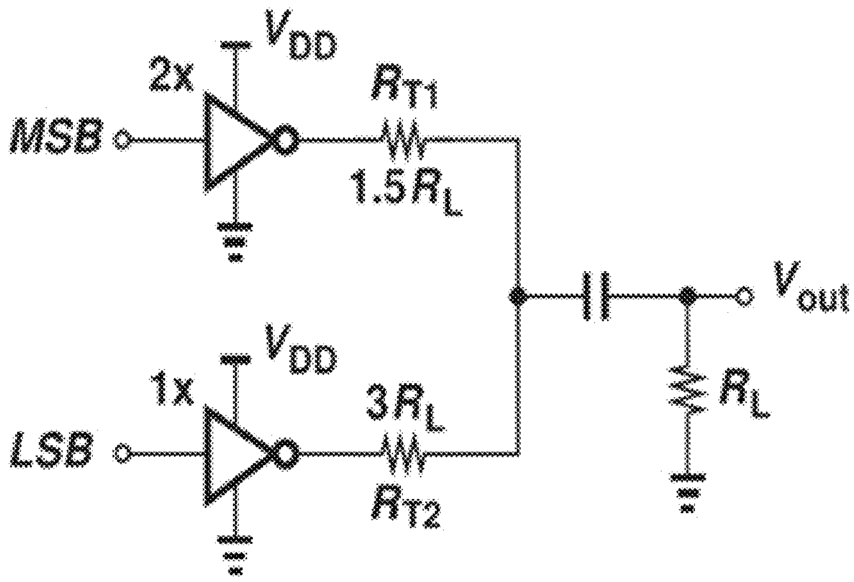
FIG. 1 is a schematic diagram of an existing driver using an SST structure.

To make the objectives, technical solutions and advantages of the present disclosure clearer, the following clearly and completely describes the technical solutions of the present disclosure with reference to the specific embodiments of the present disclosure and the corresponding accompanying drawings. Apparently, the described embodiments are only part rather than all of the embodiments of the present disclosure. On the basis of the embodiments in the present disclosure, all other embodiments acquired by those of ordinary skill in the art without creative efforts fall within a protection scope of the present disclosure. User information (including but not limited to user equipment information and user personal information) and data (including but not limited to data for analysis, data for storage and data for display) involved in the present disclosure are information and data authorized by users or fully authorized by all parties, and the collection, use and process of relevant data are required to comply with relevant laws, regulations and standards of relevant countries and regions, and corresponding operation entries are provided for users to choose authorization or rejection.

Terms in the present disclosure are described below.

Direct Current (DC) circuit: a circuit with a constant current direction, and a current magnitude of the direct current circuit can be changed, a current with constant magnitude and direction is referred to as a constant current.

Non return to zero (NRZ): a data transmission encoding mode for converting a digital signal into an electrical signal in digital communication for transmission. In NRZ encoding, each bit (0 or 1) is represented by different levels, for example, low level represents 0, and high level represents 1.

4-level pulse amplitude modulation (PAM-4): a multi-level pulse amplitude modulation technology for transmitting a high-speed data signal. In PAM-4 encoding, each symbol represents different values by modulating the amplitude of the pulse, and four possible symbols are usually represented by four discrete levels.

Source series terminated (SST): a data transmission architecture for synchronously transmitting data and clock signals in high-speed serial communication. In the SST architecture, a sender implements synchronous transmission of data and clock by adding a clock edge to the data signal so as to reduce clock offset and jitter in the transmission.

Current mode logic (CML): a high-speed digital logic circuit family usually used for a high-speed communication interface in an integrated circuit. The CML circuit adopts current mode transmission, has the characteristics of high speed, low power consumption and anti-noise interference and is widely applied in the fields of high-speed communication and computation.

The scenarios involved in the present disclosure are described below.

A driver is an important part of a wired transmitter. With the exponential growth of data throughput, in addition to a traditional NRZ data modulation mode, a high-speed wired transmitter often adopts a higher-order amplitude modulation mode: a PAM-4 signal, so the driver is also required to meet dual-mode transmission of NRZ and PAM-4.

As a module with the highest working speed and the highest output swing in the transmitter, the driver is developing towards broadband, low power consumption and high linearity.

FIG. 1 is a schematic diagram of an existing driver using an SST structure. As shown in FIG. 1, the driver using the SST structure includes: a resistor $R_{T1}$, a resistor $R_{T2}$, a resistor $R_L$, power amplifiers (2$x$ and 1$x$), a capacitor C and a power supply $V_{DD}$, where $R_{T1}=1.5R_L$ and $R_{T2}=3R_L$.

The driver implements the transmission of the PAM-4 signal by adjusting a series resistance ratio (2:1) of a least significant bit (LSB) path to a most significant bit (MSB) path.

However, since the matching impedance is a series resistance, the impedance seen from an active output node is large. For the same output swing, the driver using the SST structure has low power consumption, but the output bandwidth will be lower.

Figure 2:
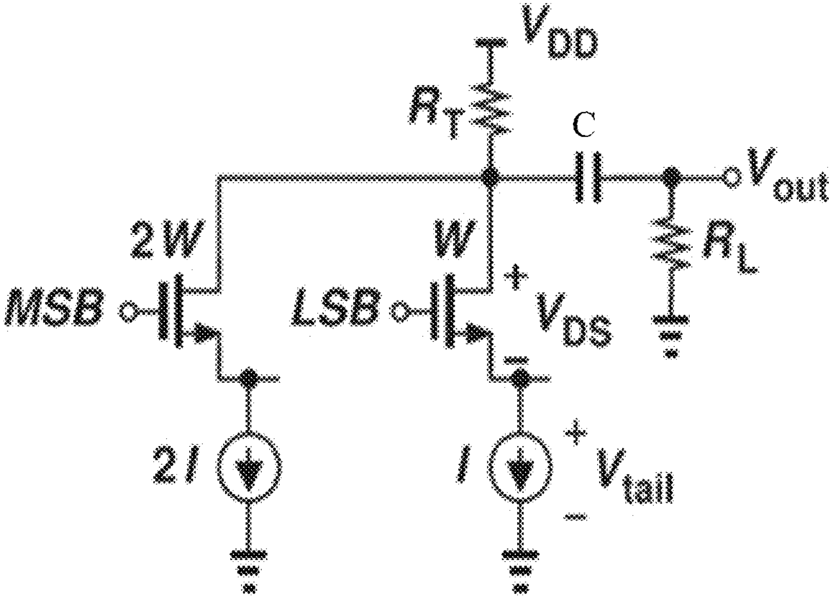
FIG. 2 is a schematic diagram of an existing driver using a CML structure.

FIG. 2 is a schematic diagram of an existing driver using a CML structure. As shown in FIG. 2, the driver using the CML structure includes: a Metal-Oxide-Semiconductor (MOS) transistor, current sources (2I and 1I), a capacitor C, a power supply $V_{DD}$, a resistor $R_L$ and a resistor $R_T$.

The voltage value across the current source at LSB is $V_{tail}$, and the voltage value across the MOS transistor at LSB is $V_{DS}$.

The driver implements the transmission of the PAM-4 signal by adjusting a tail current source ratio (1:2) of the LSB path to the MSB path.

However, since the matching impedance is a parallel resistance, the impedance seen from an active output node is smaller. For the same output swing, the driver using the CML structure has high power consumption, but the output bandwidth will be higher.

The problem to be solved is to design a driver with large output bandwidth and low power consumption.

The technical concept of the inventor is as follows. The p-type metal-oxide-semiconductor field-effect transistors (PMOS) and the n-type metal-oxide-semiconductor field-effect transistors (NMOS) can respectively constitute circuit structures of differential pairs to serve as the driver, that is, in the PAM-4 mode, (MSB/LSB) have four candidate input, namely (11), (10), (01) and (00). Taking the traditional SST structure as an example, the output voltages respectively corresponding to the four candidate inputs are (0, ⅓, ⅔ and 1). In this way, four levels are generated at the output end, that is, the required PAM-4 signals. The traditional SST circuit has small bandwidth due to large load of an output node; and the CML circuit requires a tail current source to provide a common mode voltage required by the working of the circuit, resulting in large static power consumption and large overall power consumption. The circuit structure with MOS transistors as a main body has no static power consumption, so the power consumption is small. At the same time, the number of the MOS transistors of the output node is reduced by half compared with the SST, thereby reducing the load and increasing the bandwidth. Therefore, the advantages of small power consumption and large bandwidth are achieved.

The technical solution of the present application will be described in detail below by the specific embodiments. It should be noted that the following embodiments can exist independently or in combination with each other, and the same or similar contents will not be repeated in different embodiments.

Figure 3:
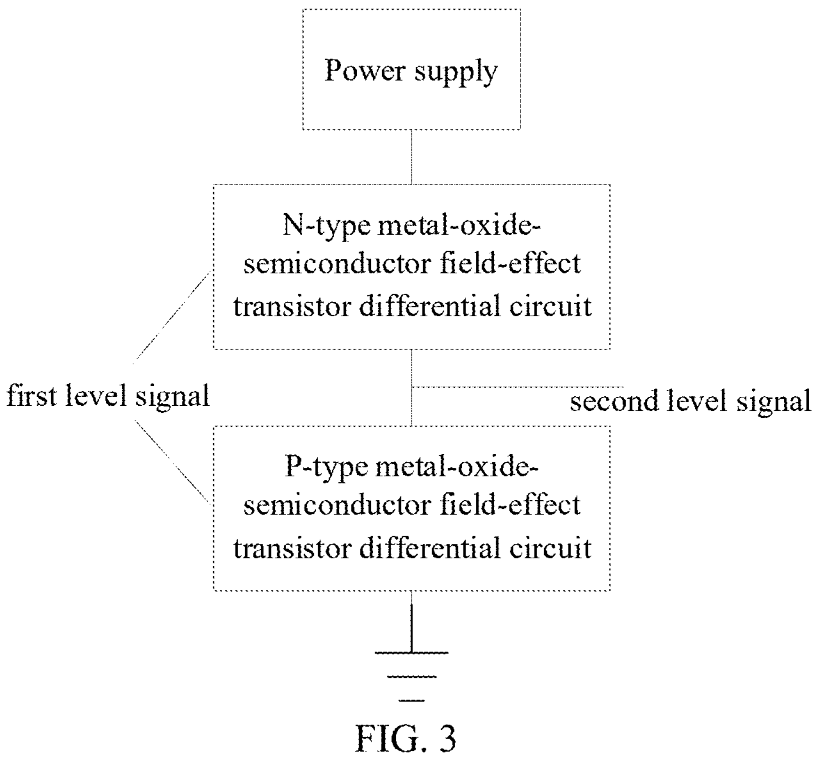
FIG. 3 is a schematic structural diagram of a driver according to an embodiment of the present disclosure.

FIG. 3 is a schematic structural diagram of a driver according to an embodiment of the present disclosure. Referring to FIG. 3, the driver includes: an n-type metal-oxide-semiconductor field-effect transistor differential circuit, a p-type metal-oxide-semiconductor field-effect transistor differential circuit and a power supply.

The power supply is connected to a source electrode of the p-type metal-oxide-semiconductor field-effect transistor differential circuit, a drain electrode of the p-type metal-oxide-semiconductor field-effect transistor differential circuit is connected to a drain electrode of the n-type metal-oxide-semiconductor field-effect transistor differential circuit, and a source electrode of the n-type metal-oxide-semiconductor field-effect transistor differential circuit is grounded.

In some embodiments, a gate electrode of the p-type metal-oxide-semiconductor field-effect transistor differential circuit and a gate electrode of the n-type metal-oxide-semiconductor field-effect transistor differential circuit are configured to receive a first level signal. The p-type metal-oxide-semiconductor field-effect transistor differential circuit and the n-type metal-oxide-semiconductor field-effect transistor differential circuit are configured to convert the first level signal into a second level signal used by an actuator. A drain electrode of the p-type metal-oxide-semiconductor field-effect transistor differential circuit and a drain electrode of the n-type metal-oxide-semiconductor field-effect transistor differential circuit are configured to output a second level signal.

For example, the gate electrode of the p-type metal-oxide-semiconductor field-effect transistor differential circuit is configured to receive LSB in the first level signal; the gate electrode of the n-type metal-oxide-semiconductor field-effect transistor differential circuit is configured to receive MSB in the first level signal; and the drain electrode of the p-type metal-oxide-semiconductor field-effect transistor differential circuit and the drain electrode of the n-type metal-oxide-semiconductor field-effect transistor differential circuit jointly output the second level signal.

In some embodiments, the driver provided by the embodiments of the present disclosure is applied to a Serdes high-speed wired transmission circuit and has the characteristics of large bandwidth and strong driving capability. A high-speed serial signal up to 56 Gbps NRZ/112 Gbps PAM-4 can be driven, and the transmission quality of the transmitted signal can be ensured.

The driver provided by the embodiments of the present disclosure includes: an n-type metal-oxide-semiconductor field-effect transistor differential circuit, a p-type metal-oxide-semiconductor field-effect transistor differential circuit and a power supply. The power supply is connected to a source electrode of the p-type metal-oxide-semiconductor field-effect transistor differential circuit, a drain electrode of the p-type metal-oxide-semiconductor field-effect transistor differential circuit is connected to a drain electrode of the n-type metal-oxide-semiconductor field-effect transistor differential circuit, and a source electrode of the n-type metal-oxide-semiconductor field-effect transistor differential circuit is grounded. A gate electrode of the p-type metal-oxide-semiconductor field-effect transistor differential circuit and a gate electrode of the n-type metal-oxide-semiconductor field-effect transistor differential circuit are configured to receive a first level signal. The p-type metal-oxide-semiconductor field-effect transistor differential circuit and the n-type metal-oxide-semiconductor field-effect transistor differential circuit are configured to convert the first level signal into a second level signal used by an actuator. A drain electrode of the p-type metal-oxide-semiconductor field-effect transistor differential circuit and a drain electrode of the n-type metal-oxide-semiconductor field-effect transistor differential circuit are configured to output a second level signal. PMOS and NMOS transistors with low power are employed to construct the driver so as to implement dual-mode transmission of PAM-4/NRZ and endow a wider output bandwidth.

Figure 4:
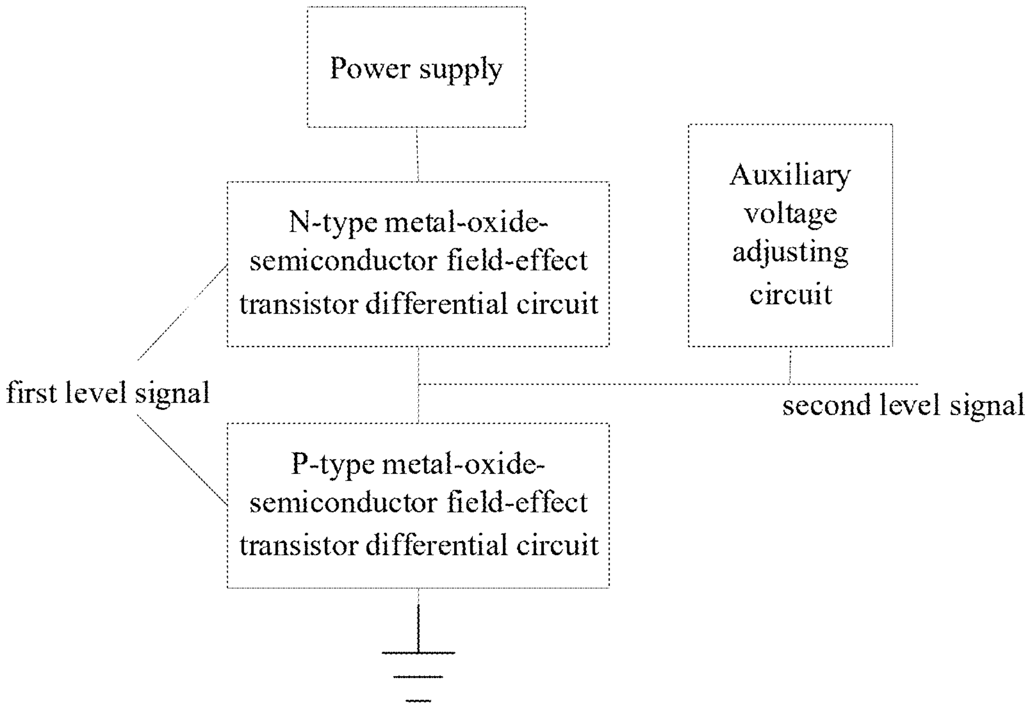
FIG. 4 is a schematic structural diagram of a driver according to another embodiment of the present disclosure.

FIG. 4 is a schematic structural diagram of a driver according to another embodiment of the present disclosure. Referring to FIG. 4, compared with the driver in FIG. 3, the driver in FIG. 4 may further include: an auxiliary voltage adjusting circuit.

The auxiliary voltage adjusting circuit is connected to a drain electrode of the p-type metal-oxide-semiconductor field-effect transistor differential circuit and a drain electrode of the n-type metal-oxide-semiconductor field-effect transistor differential circuit.

In some embodiments, when detecting that the drain electrode of the p-type metal-oxide-semiconductor field-effect transistor differential circuit and a field-effect transistor in the n-type metal-oxide-semiconductor field-effect transistor differential circuit are in an off state, the auxiliary voltage adjusting circuit provides a common mode voltage and outputs a signal. The signal is obtained by superimposing the second level signal on the common mode voltage.

The driver provided by the embodiments of the present disclosure further includes: an auxiliary voltage adjusting circuit. The auxiliary voltage adjusting circuit is connected to the drain electrode of the p-type metal-oxide-semiconductor field-effect transistor differential circuit and the drain electrode of the n-type metal-oxide-semiconductor field-effect transistor differential circuit. When detecting that the drain electrode of the p-type metal-oxide-semiconductor field-effect transistor differential circuit and the field-effect transistor in the n-type metal-oxide-semiconductor field-effect transistor differential circuit are in an off state, the auxiliary voltage adjusting circuit is configured to provide a common mode voltage and output a second level signal that is superimposed on the common mode voltage. In the technical solution, the common mode voltage of the level signal output by the driver is superimposed on the second level signal by the auxiliary voltage adjusting circuit, thereby ensuring four outputs in the PAM-4 mode.

Figure 5:
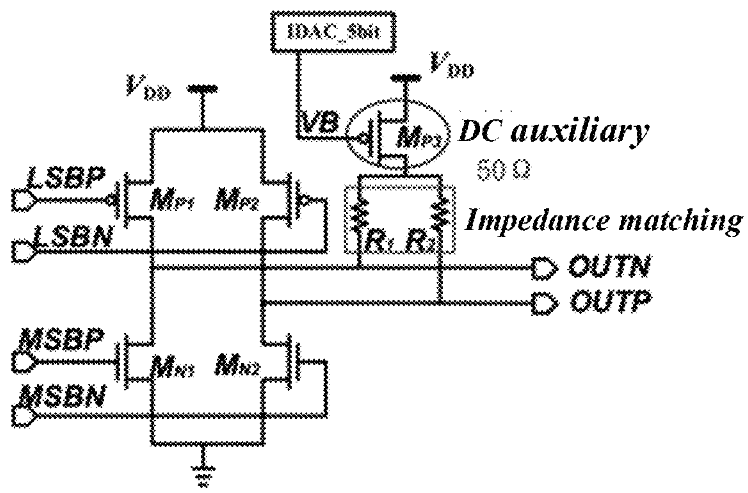
FIG. 5 is a schematic structural diagram of a driver according to another embodiment of the present disclosure.

FIG. 5 is a schematic structural diagram of a driver according to another embodiment of the present application. Referring to FIG. 5, the n-type metal-oxide-semiconductor field-effect transistor differential circuit includes: a first n-type metal-oxide-semiconductor field-effect transistor and a second n-type metal-oxide-semiconductor field-effect transistor; and the p-type metal-oxide-semiconductor field-effect transistor differential circuit includes: a first p-type metal-oxide-semiconductor field-effect transistor and a second p-type metal-oxide-semiconductor field-effect transistor.

Referring to FIG. 5, in this embodiment, the p-type metal-oxide-semiconductor field-effect transistor differential circuit includes: a first p-type metal-oxide-semiconductor field-effect transistor $M_{N1}$ and a second p-type metal-oxide-semiconductor field-effect transistor $M_{N2}$; and the n-type metal-oxide-semiconductor field-effect transistor differential circuit includes: a first n-type metal-oxide-semiconductor field-effect transistor $M_{P1}$ and a second n-type metal-oxide-semiconductor field-effect transistor $M_{P2}$; and an power supply $V_{DD}$ is provided.

In some embodiments, the gate electrode of the first n-type metal-oxide-semiconductor field-effect transistor is configured to receive a binary least significant bit positive signal in the first level signal, and the gate electrode of the second n-type metal-oxide-semiconductor field-effect transistor is configured to receive a binary least significant bit negative signal in the first level signal.

The gate electrode of the first p-type metal-oxide-semiconductor field-effect transistor is configured to receive a binary most significant bit positive signal in the first level signal, and the gate electrode of the second p-type metal-oxide-semiconductor field-effect transistor is configured to receive a binary most significant bit negative signal in the first level signal.

That is, a gate electrode of $M_{P1}$ is configured to receive MSBP, a gate electrode of $M_{P2}$ is configured to receive MSBN, a gate electrode of $M_{N1}$ is configured to receive LSBP, and a gate electrode of $M_{N2}$ is configured to receive LSBN; and a source electrode of $M_{P1}$ and a source electrode of $M_{P2}$ are connected to $V_{DD}$, and a source electrode of $M_{N1}$ and a source electrode of $M_{N2}$ are grounded.

In some embodiments, the drain electrode of the first n-type metal-oxide-semiconductor field-effect transistor is connected to the drain electrode of the first p-type metal-oxide-semiconductor field-effect transistor, and the drain electrode of the second n-type metal-oxide-semiconductor field-effect transistor is connected to the drain electrode of the second p-type metal-oxide-semiconductor field-effect transistor.

The drain electrode of the first n-type metal-oxide-semiconductor field-effect transistor and the drain electrode of the first p-type metal-oxide-semiconductor field-effect transistor are jointly configured to output a negative signal of the second level signal; and the drain electrode of the second n-type metal-oxide-semiconductor field-effect transistor and the drain electrode of the second p-type metal-oxide-semiconductor field-effect transistor are jointly configured to output a positive signal of the second level signal.

That is, a drain electrode of $M_{P1}$ is connected to a drain electrode of $M_{N1}$ and then is connected to OUTN; and a drain electrode of $M_{P2}$ is connected to a drain electrode of $M_{N2}$ and then is connected to OUTP.

In some embodiments, the auxiliary voltage adjusting circuit includes: a third p-type metal-oxide-semiconductor field-effect transistor and an integrated digital-to-analog converter. A source electrode of the third p-type metal-oxide-semiconductor field-effect transistor is connected to the power supply.

Referring to FIG. 5, in this embodiment, the auxiliary voltage adjusting circuit in the driver includes: a third p-type metal-oxide-semiconductor field-effect transistor $M_{P3}$ (that may be considered as a direct current-assisted field-effect transistor) and an integrated digital-to-analog converter (such as an integrated digital-to-analog converter with 5-bit resolution, IDAC_5bit).

A gate electrode of the third p-type metal-oxide-semiconductor field-effect transistor is connected to the integrated digital-to-analog converter and configured to receive an adjusting signal provided by the integrated digital-to-analog converter. The third p-type metal-oxide-semiconductor field-effect transistor is configured to generate a common mode voltage based on the adjusting signal.

That is, IDAC_5bit is connected to a gate electrode of $M_{P3}$ and configured to output VB, and a source electrode of $M_{P3}$ is connected to $V_{DD}$.

The default configuration of IDAC_5bit ensures that the output is ⅓ when the NMOS and PMOS transistors are turned off. In the test stage before leaving the factory, the configuration of IDAC_5bit are finely trimmed based on the linearity of an output eye diagram (that is, the following FIG. 9), which is used for compensating the fluctuation of the common mode voltage caused by the deviation of a manufacturing process.

In some embodiments, the auxiliary voltage adjusting circuit further includes: a first impedance matching resistor and a second impedance matching resistor.

A first end of the first impedance matching resistor and a first end of the second impedance matching resistor are respectively connected to a drain electrode of the third p-type metal-oxide-semiconductor field-effect transistor.

Referring to FIG. 5, in this embodiment, the auxiliary voltage adjusting circuit in the driver further includes: a first impedance matching resistor $R_1$ and a second impedance matching resistor $R_2$.

A second end of the first impedance matching resistor is connected to a drain electrode of the first n-type metal-oxide-semiconductor field-effect transistor, and the first impedance matching resistor performs impedance matching on a signal at the drain electrode of the first n-type metal-oxide-semiconductor field-effect transistor. A second end of the second impedance matching resistor is connected to a drain electrode of the second n-type metal-oxide-semiconductor field-effect transistor, and the second impedance matching resistor performs impedance matching on a signal at the drain electrode of the second n-type metal-oxide-semiconductor field-effect transistor.

In this embodiment, the function of the impedance is impedance matching and reducing intersymbol interference (ISI) and return loss. Generally, Serdes devices are mostly used in PCIe and other protocols, and these protocols require circuits to meet the input and output 50-ohm impedance matching, that is, the resistance values of the first impedance matching resistor and the second impedance matching resistor may be 50 ohm, respectively.

That is, ISI is due to the non-ideal transmission total characteristic of the system, which leads to the distortion and broadening of the waveforms of front and rear code elements and makes the front waveform appear a long tail to spread to the sampling time of the current code element, thereby interfering with the determination of the current code element.

It should be understood that: the impedance not only provides stable 50-ohm impedance matching, but also provides a common mode voltage of VDD*(⅓) in a case that MSBP=0 and LSBP=1 (that is, NMOS and PMOS are turned off), thereby ensuring the normal work of the PAM-4 mode. If there is no impedance to provide a voltage drop and when MSBP=0 and LSBP=1, the output is a high-impedance state, the output voltage is undetermined, and the circuit cannot work normally. Meanwhile, the voltage Vt (that is, the common mode voltage) can be changed by adjusting the voltage VB (that is, the output of the integrated digital-to-analog converter), so that the voltage of ⅓ vdd can be adjusted according to the output situation and the ideal linearity can be obtained.

In some embodiments, the number of the first impedance matching resistor and the number of the second impedance matching resistor are at least one, respectively.

In this embodiment, the number of the first impedance matching resistor and the number of the second impedance matching resistor are not limited, but it is necessary to ensure that the overall resistance values respectively corresponding to the first impedance matching resistor and the second impedance matching resistor are equal.

Figure 6:
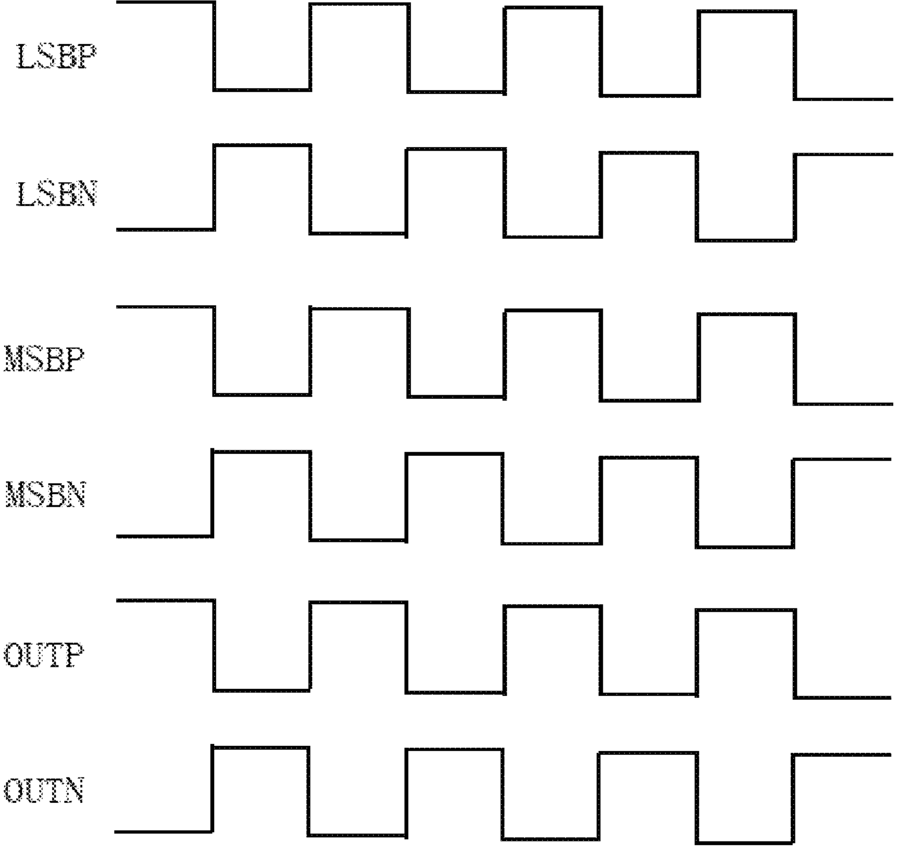
FIG. 6 shows input and output waveforms in an NRZ mode according to an embodiment of the present disclosure.
Figure 7:
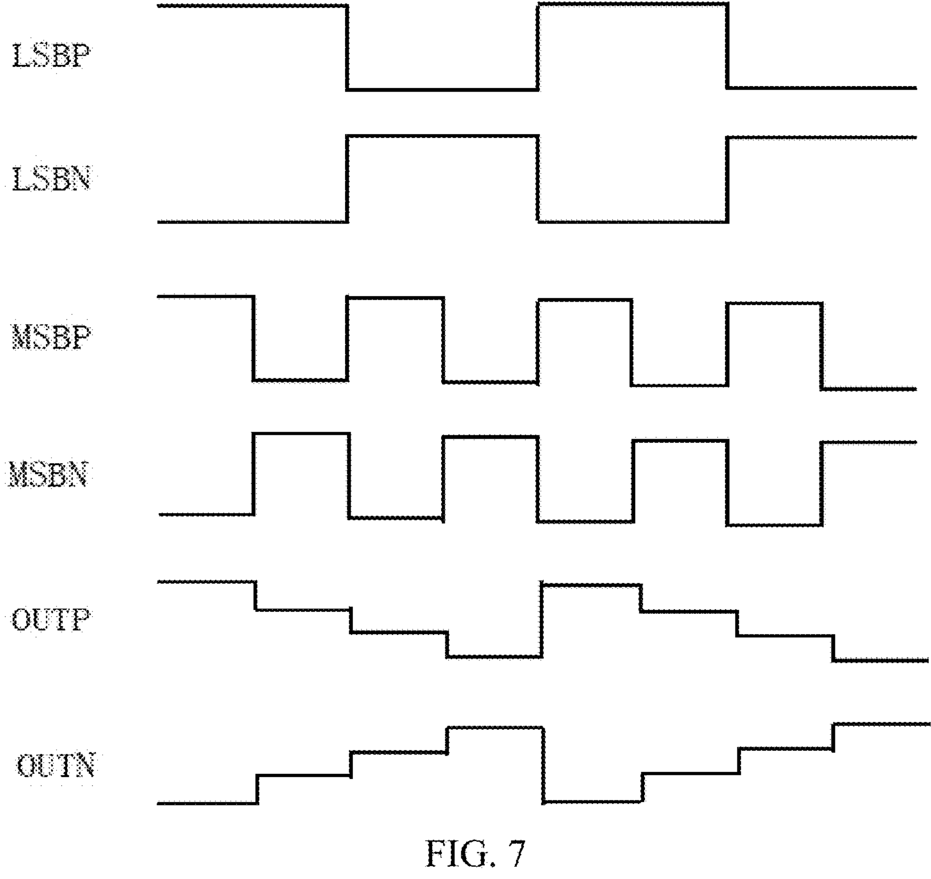
FIG. 7 shows input and output waveforms in a PAM-4 mode according to an embodiment of the present disclosure.

In this embodiment, exemplarily, for FIG. 5, examples implemented in the NRZ mode and the PAM-4 mode are shown in FIG. 6 and FIG. 7.

The first type: FIG. 6 shows input and output waveforms in an NRZ mode according to an embodiment of the present disclosure. As shown in FIG. 6, in the NRZ mode, the inputs of LSBP and MSBP are respectively (1,1) and (0,0), and the corresponding OUTP and OUTN are shown as 0/1 level.

The analysis is as follows. In the NRZ mode, the input signal MSBP=LSBP. Therefore, there are only two possible inputs, MSBP=LSBP=1 or MSBP=LSBP=0. Correspondingly, due to the differential structure, when MSBP=LSBP=1, MSBN=LSBN=0, and when MSBP=LSBP=0, MSBN=LSBN=1.

If MSBP=LSBP=1, the NMOS transistor is turned on, the PMOS transistor is turned off, and the potential of the OUTN node will be pulled down to the ground by the NMOS transistor, so the output is 0. If MSBP=LSBP=0, the NMOS transistor is turned off, the PMOS transistor is turned on, and the potential of the OUTN node will be pulled up to the power supply by the PMOS transistor, so the output is 1.

The second type: FIG. 7 shows input and output waveforms in a PAM-4 mode according to an embodiment of the present disclosure. As shown in FIG. 7, in the PAM-4 mode, the inputs of LSBP and MSBP are respectively (1,1), (0,0), (1,0) and (0,1), and the corresponding OUTP and OUTN are shown as (0, ⅓, ⅔, 1) levels.

The analysis is as follow. In the PAM-4 mode, there are four possible inputs, (1) MSBP=LSBP=1, (2) MSBP=LSBP=0, (3) MSBP=1 and LSBP=0, and (4)

MSBP=0 and LSBP=1. Correspondingly, due to the differential structure, the change principle of MSBN=LSBN is the same as above.

If MSBP=LSBP=1, as the NRZ analysis, the output is 0. If MSBP=0 and LSBP=1, the NMOS transistor is turned off, the PMOS is also turned off, the OUTN node is equal to the common mode voltage (that is, voltage Vt) output by the auxiliary voltage adjusting circuit, and Vt can be equal to VDD*(⅓) through the circuit design.

If MSBP=1 and LSBP=0, the NMOS transistor is turned on, the PMOS transistor is also turned on, and the OUTN voltage at this time can be at VDD*(⅔) by designing the sizes of the PMOS transistor and the NMOS transistor. If MSBP=LSBP=0, as the NRZ analysis, the output is 1. That is, 4-level output is implemented, that is, the PAM-4 signal.

The traditional SST circuit has small bandwidth due to large load of an output node, and the CML circuit requires a tail current source to provide a common mode voltage required by the working of the circuit, resulting in large static power consumption and large overall power consumption. The structure proposed by the present disclosure has no static power consumption, so the power consumption is small. At the same time, the number of the MOS transistors of the output node is reduced by half compared with the SST circuit, thereby reducing the load and increasing the bandwidth. Therefore, the advantages of small power consumption and large bandwidth are achieved by the present disclosure. Meanwhile, the output linearity can be subjected to fine granularity adjustment by adjusting the voltage VB.

Figure 8:
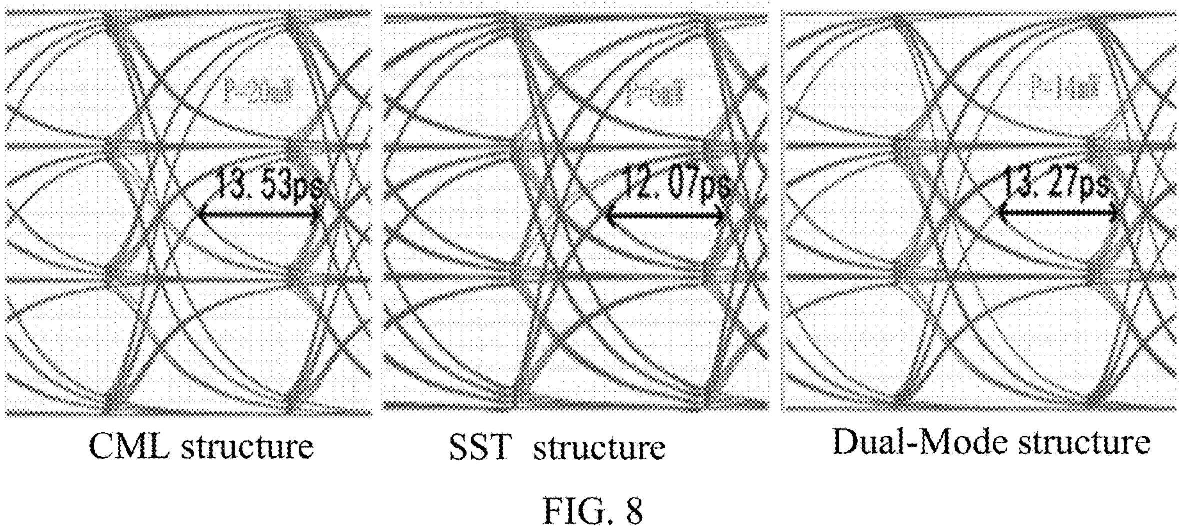
FIG. 8 is eye diagrams of an existing driver in a CML structure, an existing driver in an SST structure, and a driver in a dual-model structure provided by the present disclosure.

FIG. 8 is eye diagrams of an existing driver in a CML structure, an existing driver in an SST structure, and a driver in a dual-model structure provided by the present disclosure. As shown in FIG. 8, the structure of the driver of the present disclosure has the advantages in speed and power consumption compared with the existing structures.

Specifically, the power consumption of the driver in the CML structure is 20 mW, while the power consumption of the driver with the dual-mode structure of the present disclosure is 14 mW and is only 70% of the CML structure. The output intermediate eye of the driver with the SST structure is 12.07 ps, while the output intermediate eye of the driver with the dual-mode structure of the present disclosure is 13.27 ps.

The current magnitude of the direct current auxiliary current source is adjusted by 5-bit IDAC, and the adjusting range of the control voltage VB (that is, the voltage provided by the integrated digital-to-analog converter) may be 0.195V to 0.463V.

Figure 9:
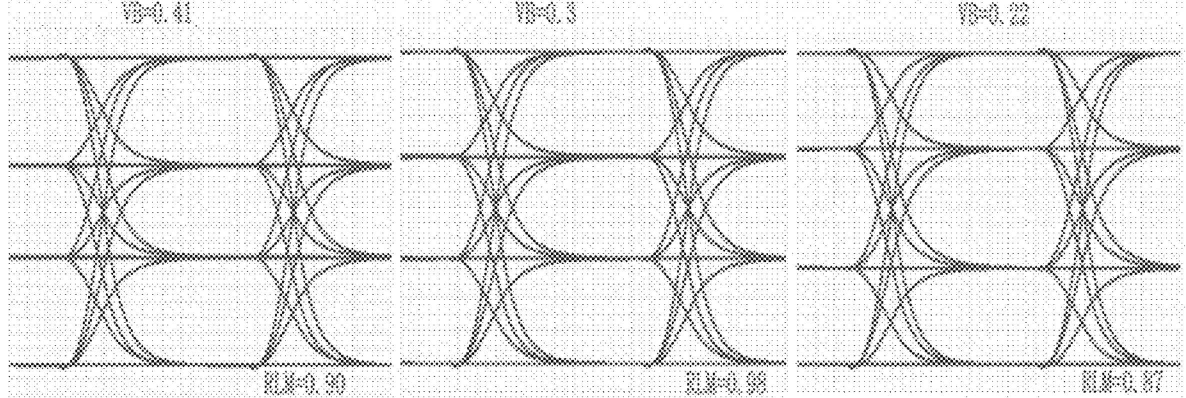
FIG. 9 shows influence of a control voltage VB on an output linearity of a driver.

FIG. 9 shows influence of a control voltage VB on an output linearity of a driver. As shown in FIG. 9, with the reduction of the control voltage VB, the eye height of the output intermediate eye of the driver is increased. Therefore, the linearity of the driver can be adjusted by adjusting VB.

For example, when the control voltage VB is 0.41V, the level separation mismatch ratio (RLM) is 0.9; when the control voltage VB is 0.3V, RLM is 0.98; and when the control voltage VB is 0.22V, RLM is 0.87.

In some embodiments, the PMOS transistor and the NMOS transistor are a CMOS process commonly used at present. In some embodiments, CMOS transistor may be replaced with bipolar junction transistor. For advanced 3 nm and 5 nm CMOS processes, the CMOS transistor cannot be replaced with the bipolar junction transistor and other devices.

According to the driver provided by the embodiments of the present disclosure, the n-type metal-oxide-semiconductor field-effect transistor differential circuit includes: a first n-type metal-oxide-semiconductor field-effect transistor and a second n-type metal-oxide-semiconductor field-effect transistor; the p-type metal-oxide-semiconductor field-effect transistor differential circuit includes: a first p-type metal-oxide-semiconductor field-effect transistor and a second p-type metal-oxide-semiconductor field-effect transistor; a gate electrode of the first n-type metal-oxide-semiconductor field-effect transistor is configured to receive a binary least significant bit positive signal in the first level signal, and a gate electrode of the second n-type metal-oxide-semiconductor field-effect transistor is configured to receive a binary least significant bit negative signal in the first level signal; a gate electrode of the first p-type metal-oxide-semiconductor field-effect transistor is configured to receive a binary most significant bit positive signal in the first level signal, and a gate electrode of the second p-type metal-oxide-semiconductor field-effect transistor is configured to receive a binary most significant bit negative signal in the first level. The level signal input to the driver is converted into a level signal executable by the actuator.

Figure 10:
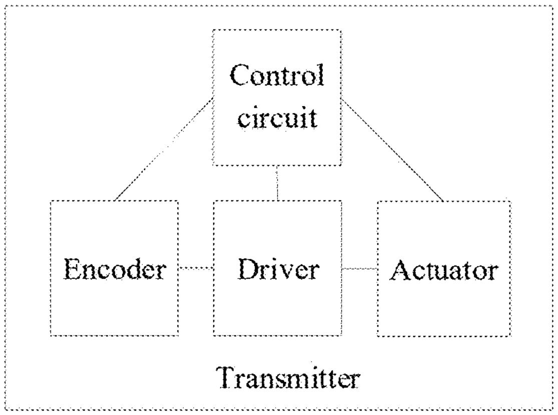
FIG. 10 is a schematic structural diagram of a transmitter according to an embodiment of the present disclosure.

FIG. 10 is a schematic structural diagram of a transmitter according to an embodiment of the present application. Referring to FIG. 10, the transmitter includes: a driver, an encoder, an actuator and a control circuit.

In some embodiments, the control circuit is respectively connected to the driver, the encoder and the actuator and configured to monitor and adjust the operation states of the driver, the encoder and the actuator.

The encoder is connected to the driver and configured to input a first level signal to the driver, and the driver is configured to convert the first level signal into a second level signal.

The actuator is connected to the driver and configured to receive the second level signal and execute a specific action corresponding to the second level signal.

In some embodiments, in the Serdes circuit, a low-speed parallel signal is encoded by the encoder first and then appropriately encoded according to different working modes. Then, the low-speed parallel signal is converted into a high-speed serial signal through a parallel-serial converter, and then is outputted to the driver. The driver is the driver provided by the embodiments of the present disclosure (that may be considered as a dual-mode driver), and is mainly applied to high-speed wired signal transmission.

In addition, the embodiments of the present disclosure further provide a data interface circuit, and the data interface circuit includes: a driver, and the driver is the driver in the above embodiments.

The data interface circuit is a circuit for connecting an external device and a main control chip of the system, and is used for transmitting the data signal from the external device to the main control chip of the system or from the main control chip of the system to the external device; and the data interface circuit may be the above Serdes circuit.

In some embodiments, the data interface circuit may further include: a buffer, a clock circuit, a signal modulation circuit, a data decoding circuit and the like.

For example, the driver is used for converting the first level signal (such as a control signal) generated by the main control chip of the system into an appropriate level or current (that is, the second level signal) and transmitting the appropriate level or current to the external device, so that sufficient driving capability can be provided, good signal-to-noise ratio of the signal can be ensured, and signal distortion can be avoided. The buffer is configured to enhance the impedance matching property of the circuit, provide signal amplification and circuit isolation functions and ensure the stability and reliability of signal transmission. The signal modulation circuit is configured to adjust the level and the current level of the control signal so as to adapt to the voltage and current requirement among different devices. The clock circuit provides a synchronous clock signal of the system so as to ensure that the sequence and timing of data transmission are correct. The data decoding circuit is configured to convert the received data signal into digital or analog data, so that the main control chip of the system can perform further processing conveniently.

In some embodiments, audio data is outputted from a mobile phone to an earphone. In this process, the data interface circuit plays a key role. The data interface circuit is connected to the mobile phone and the earphone and is used for the transmission of the audio data. The driver is used for converting the audio signal generated by the mobile phone into an appropriate voltage or current and transmitting the appropriate voltage or current to the earphone through the data interface circuit. The buffer is configured to enhance the stability of the signal. The clock circuit ensures the real-time transmission and synchronization of the audio data. After receiving the signal, the earphone performs decoding and amplification, so that a user can hear clear audio.

It should further be noted that, the terms "comprise", "include" and any other variants thereof are intended to cover non-exclusive inclusion, so that a process, a method, a commodity, or a device that includes a series of elements not only includes these very elements, but may also include other elements not expressly listed, or also include elements inherent to this process, method, commodity, or device. Without more restrictions, an element defined by the phrase "including a . . . " does not exclude the presence of another same element in a process, method, product, or device that includes the element.

The above is only an embodiment of the present disclosure and is not intended to limit the present disclosure. For those skilled in the art, the present disclosure may have various modifications and changes. Any modifications, equivalent substitutions, improvements and the like made within the spirit and principle of the present disclosure should be included within the scope of the claims of the present disclosure.

What is claimed is:

1. A driver, comprising: an n-type metal-oxide-semiconductor field-effect transistor differential circuit, a p-type metal-oxide-semiconductor field-effect transistor differential circuit and a power supply, and an auxiliary voltage adjusting circuit, the power supply is connected to a source electrode of the p-type metal-oxide-semiconductor field-effect transistor differential circuit, a drain electrode of the p-type metal-oxide-semiconductor field-effect transistor differential circuit is connected to a drain electrode of the n-type metal-oxide-semiconductor field-effect transistor differential circuit, and a source electrode of the n-type metal-oxide-semiconductor field-effect transistor differential circuit is grounded;

a gate electrode of the p-type metal-oxide-semiconductor field-effect transistor differential circuit and a gate electrode of the n-type metal-oxide-semiconductor field-effect transistor differential circuit are configured to receive a first level signal, the p-type metal-oxide-semiconductor field-effect transistor differential circuit and the n-type metal-oxide-semiconductor field-effect transistor differential circuit are configured to convert the first level signal into a second level signal used by an actuator; and the drain electrode of the p-type metal-oxide-semiconductor field-effect transistor differential circuit and the drain electrode of the n-type metal-oxide-semiconductor field-effect transistor differential circuit are configured to output the second level signal, the auxiliary voltage adjusting circuit is connected to the drain electrode of the p-type metal-oxide-semiconductor field-effect transistor differential circuit and the drain electrode of the n-type metal-oxide-semiconductor field-effect transistor differential circuit; and when detecting that the drain electrode of the p-type metal-oxide-semiconductor field-effect transistor differential circuit and a field-effect transistor in the n-type metal-oxide-semiconductor field-effect transistor differential circuit are in an off state, the auxiliary voltage adjusting circuit provides a common mode voltage and outputs a signal, wherein the signal is obtained by superimposing the second level signal on the common mode voltage, wherein the n-type metal-oxide-semiconductor field-effect transistor differential circuit comprises: a first n-type metal-oxide-semiconductor field-effect transistor and a second n-type metal-oxide-semiconductor field-effect transistor; and a gate electrode of the first n-type metal-oxide-semiconductor field-effect transistor is configured to receive a binary least significant bit positive signal in the first level signal, and a gate electrode of the second n-type metal-oxide-semiconductor field-effect transistor is configured to receive a binary least significant bit negative signal in the first level signal.

2. The driver according to claim 1, wherein the p-type metal-oxide-semiconductor field-effect transistor differential circuit comprises: a first p-type metal-oxide-semiconductor field effect transistor and a second p-type metal-oxide-semiconductor field effect transistor; and a gate electrode of the first p-type metal-oxide-semiconductor field-effect transistor is configured to receive a binary most significant bit positive signal in the first level signal, and a gate electrode of the second p-type metal-oxide-semiconductor field-effect transistor is configured to receive a binary most significant bit negative signal in the first level signal.

3. The driver according to claim 2, wherein a drain electrode of the first n-type metal-oxide-semiconductor field-effect transistor is connected to a drain electrode of the first p-type metal-oxide-semiconductor field-effect transistor, and a drain electrode of the second n-type metal-oxide-semiconductor field-effect transistor is connected to a drain electrode of the second p-type metal-oxide-semiconductor field-effect transistor;

the drain electrode of the first n-type metal-oxide-semiconductor field-effect transistor and the drain electrode of the first p-type metal-oxide-semiconductor field-effect transistor are jointly configured to output a negative signal of the second level signal; and the drain electrode of the second n-type metal-oxide-semiconductor field-effect transistor and the drain electrode of the second p-type metal-oxide-semiconductor field-effect transistor are jointly configured to output a positive signal of the second level signal.

4. The driver according to claim 1, wherein the auxiliary voltage adjusting circuit comprises: a third p-type metal-oxide-semiconductor field-effect transistor and an integrated digital-to-analog converter; a source electrode of the third p-type metal-oxide-semiconductor field-effect transistor is connected to the power supply;

a gate electrode of the third p-type metal-oxide-semiconductor field-effect transistor is connected to the integrated digital-to-analog converter and configured to receive an adjusting signal outputted by the integrated digital-to-analog converter; and the third p-type metal-oxide-semiconductor field-effect transistor is configured to generate the common mode voltage based on the adjusting signal.

5. The driver according to claim 4, wherein the auxiliary voltage adjusting circuit further comprises: a first impedance matching resistor and a second impedance matching resistor;

a first end of the first impedance matching resistor and a first end of the second impedance matching resistor are both connected to a drain electrode of the third p-type metal-oxide-semiconductor field-effect transistor; and a second end of the first impedance matching resistor is connected to a drain electrode of the first n-type metal-oxide-semiconductor field-effect transistor, and the first impedance matching resistor performs impedance matching processing on a signal at the drain electrode of the first n-type metal-oxide-semiconductor field-effect transistor; and a second end of the second impedance matching resistor is connected to a drain electrode of the second n-type metal-oxide-semiconductor field-effect transistor, and the second impedance matching resistor performs impedance matching processing on a signal at the drain electrode of the second n-type metal-oxide-semiconductor field-effect transistor.

6. The driver according to claim 5, wherein a number of the first impedance matching resistor is at least one, and a number of the second impedance matching resistor is at least one.

7. The driver according to claim 4, wherein the integrated digital-to-analog converter is an integrated digital-to-analog converter with 5-bit resolution.

8. A transmitter, comprising a driver, an encoder, an actuator and a control circuit, wherein the control circuit is respectively connected to the driver, the encoder and the actuator and configured to monitor and adjust the operation states of the driver, the encoder and the actuator;

the encoder is connected to the driver and configured to input a first level signal to the driver;

the driver is configured to convert the first level signal into a second level signal;

the actuator is connected to the driver and configured to receive the second level signal and execute an action corresponding to the second level signal; and the driver comprises: an n-type metal-oxide-semiconductor field-effect transistor differential circuit, a p-type metal-oxide-semiconductor field-effect transistor differential circuit and a power supply, and an auxiliary voltage adjusting circuit, the power supply is connected to a source electrode of the p-type metal-oxide-semiconductor field-effect transistor differential circuit, a drain electrode of the p-type metal-oxide-semiconductor field-effect transistor differential circuit is connected to a drain electrode of the n-type metal-oxide-semiconductor field-effect transistor differential circuit, and a source electrode of the n-type metal-oxide-semiconductor field-effect transistor differential circuit is grounded, a gate electrode of the p-type metal-oxide-semiconductor field-effect transistor differential circuit and a gate electrode of the n-type metal-oxide-semiconductor field-effect transistor differential circuit are configured to receive the first level signal, the p-type metal-oxide-semiconductor field-effect transistor differential circuit and the n-type metal-oxide-semiconductor field-effect transistor differential circuit are configured to convert the first level signal into the second level signal, and the drain electrode of the p-type metal-oxide-semiconductor field-effect transistor differential circuit and the drain electrode of the n-type metal-oxide-semiconductor field-effect transistor differential circuit are configured to output the second level signal, the auxiliary voltage adjusting circuit is connected to the drain electrode of the p-type metal-oxide-semiconductor field-effect transistor differential circuit and the drain electrode of the n-type metal-oxide-semiconductor field-effect transistor differential circuit; and when detecting that the drain electrode of the p-type metal-oxide-semiconductor field-effect transistor differential circuit and a field-effect transistor in the n-type metal-oxide-semiconductor field-effect transistor differential circuit are in an off state, the auxiliary voltage adjusting circuit provides a common mode voltage and outputs a signal, wherein the signal is obtained by superimposing the second level signal on the common mode voltage, wherein the n-type metal-oxide-semiconductor field-effect transistor differential circuit comprises: a first n-type metal-oxide-semiconductor field-effect transistor and a second n-type metal-oxide-semiconductor field-effect transistor; and a gate electrode of the first n-type metal-oxide-semiconductor field-effect transistor is configured to receive a binary least significant bit positive signal in the first level signal, and a gate electrode of the second n-type metal-oxide-semiconductor field-effect transistor is configured to receive a binary least significant bit negative signal in the first level signal.

9. The transmitter according to claim 8, wherein the p-type metal-oxide-semiconductor field-effect transistor differential circuit comprises: a first p-type metal-oxide-semiconductor field effect transistor and a second p-type metal-oxide-semiconductor field effect transistor; and a gate electrode of the first p-type metal-oxide-semiconductor field-effect transistor is configured to receive a binary most significant bit positive signal in the first level signal, and a gate electrode of the second p-type metal-oxide-semiconductor field-effect transistor is configured to receive a binary most significant bit negative signal in the first level signal.

10. The transmitter according to claim 9, wherein a drain electrode of the first n-type metal-oxide-semiconductor field-effect transistor is connected to a drain electrode of the first p-type metal-oxide-semiconductor field-effect transistor, and a drain electrode of the second n-type metal-oxide-semiconductor field-effect transistor is connected to a drain electrode of the second p-type metal-oxide-semiconductor field-effect transistor;

the drain electrode of the first n-type metal-oxide-semiconductor field-effect transistor and the drain electrode of the first p-type metal-oxide-semiconductor field-effect transistor are jointly configured to output a negative signal of the second level signal; and the drain electrode of the second n-type metal-oxide-semiconductor field-effect transistor and the drain electrode of the second p-type metal-oxide-semiconductor field-effect transistor are jointly configured to output a positive signal of the second level signal.

11. The transmitter according to claim 8, wherein the auxiliary voltage adjusting circuit comprises: a third p-type metal-oxide-semiconductor field-effect transistor and an integrated digital-to-analog converter; a source electrode of the third p-type metal-oxide-semiconductor field-effect transistor is connected to the power supply;

a gate electrode of the third p-type metal-oxide-semiconductor field-effect transistor is connected to the integrated digital-to-analog converter and configured to receive an adjusting signal outputted by the integrated digital-to-analog converter; and the third p-type metal-oxide-semiconductor field-effect transistor is configured to generate the common mode voltage based on the adjusting signal.

12. The transmitter according to claim 11, wherein the auxiliary voltage adjusting circuit further comprises: a first impedance matching resistor and a second impedance matching resistor;

a first end of the first impedance matching resistor and a first end of the second impedance matching resistor are both connected to a drain electrode of the third p-type metal-oxide-semiconductor field-effect transistor; and a second end of the first impedance matching resistor is connected to a drain electrode of the first n-type metal-oxide-semiconductor field-effect transistor, and the first impedance matching resistor performs impedance matching processing on a signal at the drain electrode of the first n-type metal-oxide-semiconductor field-effect transistor; and a second end of the second impedance matching resistor is connected to a drain electrode of the second n-type metal-oxide-semiconductor field-effect transistor, and the second impedance matching resistor performs impedance matching processing on a signal at the drain electrode of the second n-type metal-oxide-semiconductor field-effect transistor.

13. The transmitter according to claim 12, wherein a number of the first impedance matching resistor is at least one, and a number of the second impedance matching resistor is at least one.

14. The driver according to claim 11, wherein the integrated digital-to-analog converter is an integrated digital-to-analog converter with 5-bit resolution.

15. A data interface circuit, comprising a driver, wherein the driver comprises: an n-type metal-oxide-semiconductor field-effect transistor differential circuit, a p-type metal-oxide-semiconductor field-effect transistor differential circuit and a power supply, and an auxiliary voltage adjusting circuit, the power supply is connected to a source electrode of the p-type metal-oxide-semiconductor field-effect transistor differential circuit, a drain electrode of the p-type metal-oxide-semiconductor field-effect transistor differential circuit is connected to a drain electrode of the n-type metal-oxide-semiconductor field-effect transistor differential circuit, and a source electrode of the n-type metal-oxide-semiconductor field-effect transistor differential circuit is grounded, a gate electrode of the p-type metal-oxide-semiconductor field-effect transistor differential circuit and a gate electrode of the n-type metal-oxide-semiconductor field-effect transistor differential circuit are configured to receive the first level signal, the p-type metal-oxide-semiconductor field-effect transistor differential circuit and the n-type metal-oxide-semiconductor field-effect transistor differential circuit are configured to convert the first level signal into the second level signal, and the drain electrode of the p-type metal-oxide-semiconductor field-effect transistor differential circuit and the drain electrode of the n-type metal-oxide-semiconductor field-effect transistor differential circuit are configured to output the second level signal, the auxiliary voltage adjusting circuit is connected to the drain electrode of the p-type metal-oxide-semiconductor field-effect transistor differential circuit and the drain electrode of the n-type metal-oxide-semiconductor field-effect transistor differential circuit; and when detecting that the drain electrode of the p-type metal-oxide-semiconductor field-effect transistor differential circuit and a field-effect transistor in the n-type metal-oxide-semiconductor field-effect transistor differential circuit are in an off state, the auxiliary voltage adjusting circuit provides a common mode voltage and outputs a signal, wherein the signal is obtained by superimposing the second level signal on the common mode voltage, wherein the n-type metal-oxide-semiconductor field-effect transistor differential circuit comprises: a first n-type metal-oxide-semiconductor field-effect transistor and a second n-type metal-oxide-semiconductor field-effect transistor; and a gate electrode of the first n-type metal-oxide-semiconductor field-effect transistor is configured to receive a binary least significant bit positive signal in the first level signal, and a gate electrode of the second n-type metal-oxide-semiconductor field-effect transistor is configured to receive a binary least significant bit negative signal in the first level signal.

* * * * *